(12) United States Patent
Aoki et al.

(10) Patent No.: US 6,477,041 B2
(45) Date of Patent: Nov. 5, 2002

(54) COMPUTER ASSEMBLY WITH CAPTIVATED SCREW CARRIER

(75) Inventors: Russell S. Aoki, Tacoma; Eric D. McAfee, DuPont; Grant F. Steen, Gig Harbor, all of WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/783,167

(22) Filed: Feb. 13, 2001

(65) Prior Publication Data

US 2002/0109963 A1 Aug. 15, 2002

(51) Int. Cl.[7] .................................................. H01B 1/03
(52) U.S. Cl. ........................ 361/684; 361/813; 361/801; 411/103; 211/49
(58) Field of Search ................................. 361/683, 727, 361/753, 758, 759, 801, 813, 684; 411/369, 103; 381/172; 211/40–49

(56) References Cited

U.S. PATENT DOCUMENTS

| 5,711,711 | A | * | 1/1998 | Schmidt, Jr. .................. 470/41 |
| 6,011,699 | A | * | 1/2000 | Murray et al. ............... 361/814 |
| 6,321,919 | B1 | * | 11/2001 | Katsuura et al. ......... 211/41.11 |
| 6,339,457 | B1 | * | 1/2002 | Won ............................ 349/58 |

* cited by examiner

*Primary Examiner*—Darren Schuberg
*Assistant Examiner*—Hung Van Duong
(74) *Attorney, Agent, or Firm*—Mark V. Seeley

(57) ABSTRACT

A computer assembly is described. That computer assembly includes a plate that contains a plurality of receptacles for receiving a plurality of fasteners, and that has a plurality of openings for enabling components to pass through it. The computer assembly also includes a plurality of fasteners, each being coupled to a receptacle, and a printed circuit board. The printed circuit board is attached to the plate by the plurality of fasteners, and a plurality of components pass through the openings formed in the plate.

11 Claims, 1 Drawing Sheet

COMPUTER ASSEMBLY WITH CAPTIVATED SCREW CARRIER

FIELD OF THE INVENTION

The present invention relates to computer systems. In particular, it relates to an assembly in which a printed circuit board is attached to a computer's chassis in a unique way.

BACKGROUND OF THE INVENTION

When assembling a computer system, it may be necessary to attach one or more printed circuit boards ("PCBs") to a computer chassis. This is typically done by using a number of screws to connect these components together. When those screws comprise discrete fasteners, they can be dropped into the chassis during computer assembly or PCB field replacement. Having loose screws move about a chassis is undesirable as they can cause short circuits. For that reason, captivated fasteners may be required for PCB retention, e.g., for field replaceable parts that are used in back-end servers.

Such fasteners can be designed into the PCB. The resulting assembly, however, requires the PCB to include large mounting holes, which impose unfavorable layout constraints and/or require large trace and component keep outs to be positioned around them. In addition, the PCB can be damaged when the fastener is pressed into it. An alternative, in which PCB retention screws are snapped into large holes that are formed in the board, presents similar disadvantages while requiring the back of the board to accommodate the fastener's protruding snap feature. Another technique, which is somewhat cumbersome to apply, consists of attaching the PCB to a sheet metal carrier using loose screws, then connecting the PCB/sheet metal carrier assembly to the chassis with screws that are captivated within the sheet metal carrier.

Accordingly, there is a need for a computer assembly with an improved mechanism for attaching PCBs to a computer chassis using captivated fasteners. There is a need for such an assembly that can be easily put together, and which does not require PCBs to include large mounting holes or large trace and component keep outs. The present invention provides such an assembly.

DETAILED DESCRIPTION OF THE PRESENT INVENTION

A computer assembly is described. That computer assembly includes a plate that contains a plurality of receptacles for receiving a plurality of fasteners, and that has a plurality of openings for enabling components to pass through it. The computer assembly also includes a printed circuit board and a plurality of fasteners, each fastener being coupled to a receptacle. The printed circuit board is attached to the plate by the plurality of fasteners, wherein a plurality of components pass through the openings formed in the plate.

In the following description, specific details are given to provide a thorough understanding of the present invention. However, it will be apparent to those skilled in the art that the invention may be practiced in many ways other than those expressly described here. The invention is thus not limited by the specific details disclosed below.

Figure 1:
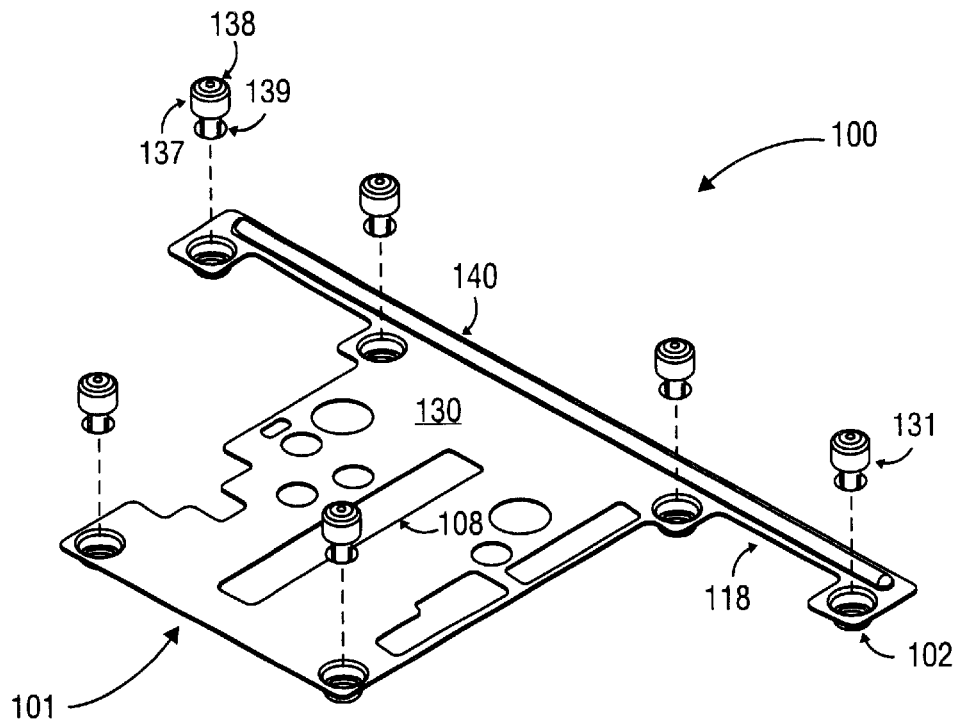
FIG. 1 illustrates an embodiment of a captivated screw carrier that can be used to make the computer assembly of the present invention.

FIG. 1 illustrates one embodiment of a captivated screw carrier that can be used to make the computer assembly of the present invention. Screw carrier 100 comprises plate 101 and a plurality of fasteners 131. Plate 101 includes substantially rectangular base 130 and elongated section 140, which is formed along one side of base 130. Plate 101 may be a single integrated plastic part that is formed using a vacuum molding process. Alternatively, an injection molding process may be used to form plate 101, or it may consist of multiple sections. Instead of plastic, plate 101 can be made from sheet metal or another suitable material, as will be apparent to those skilled in the art. Plate 101 is preferably made from an anti-static material.

Plate 101 includes a plurality of receptacles 102, which are formed on both base 130 and section 140. Each receptacle receives a fastener, in this case a captivated screw. Captivated screws 131 may comprise standard parts (e.g., stock items available from Penn Engineering & Manufacturing Corp., Southco, Inc., or other vendors of specialized fasteners and latches) that can be snapped into place by hand into receptacles 102. Such a self-captivating component includes casing 137 and screw 138. Casing 137 holds screw 138 such that the screw can independently move along a line that is perpendicular to the plane of plate 101. Each captivated screw includes a plurality of expandable prongs 139. Prongs 139 can extend through a receptacle, then latch underneath it to bind the captivated screw to the receptacle. Although this embodiment employs as fasteners captivated screws, those skilled in the art will appreciate that any fastener, which may be used to couple a PCB to a computer chassis, falls within the spirit and scope of the present invention.

In this embodiment of the present invention, receptacles 102 form pockets or cups that extend a distance from the plane of plate 101. By extending below the surface of plate 101, receptacles 102 may generate space between plate 101 and a PCB that is coupled to it. This enables low profile components to be mounted to the PCB beneath plate 101.

Plate 101 also includes a plurality of openings 108 and a plurality of indented sections 118. Openings 108 enable components to pass through it. Such components may include cables, wires or other connecting members that will pass through those openings prior to being coupled to components that are mounted onto the PCB. Alternatively, they may comprise relatively high profile parts that are coupled to the PCB, such as various I/O components like PCI cards, different types of daughter cards, or their connectors. Indented sections 118 enable plate 101 to straddle other types of PCB components. Like the spacing that receptacles 102 offer, these openings and indented sections allow plate 101 to attach to a PCB without interfering with the operation or placement of components that are fixed to the board, or various types of connectors that must contact those components.

Figure 2:
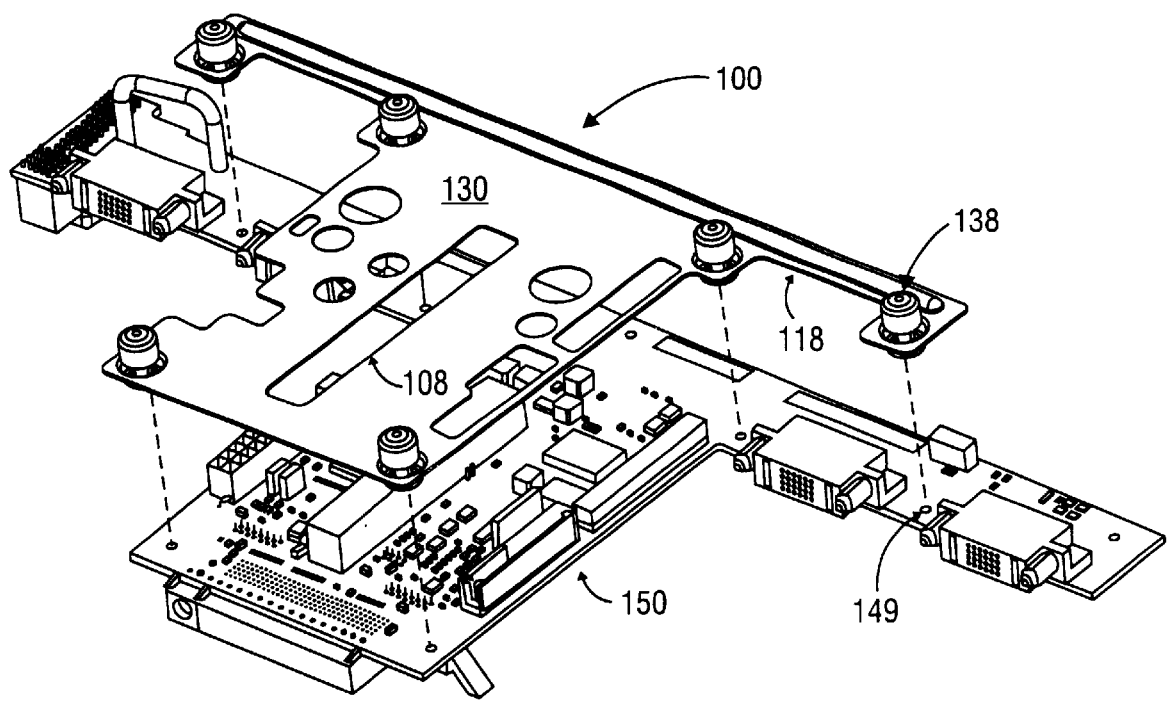
FIG. 2 illustrates an embodiment of the computer assembly of the present invention in which the captivated screw carrier of FIG. 1 is used to attach a PCB to a computer chassis.

FIG. 2 illustrates an embodiment of the computer assembly of the present invention in which captivated screw carrier 100 of FIG. 1 is used to attach PCB 150 to a computer chassis (not shown). In this embodiment, PCB 150 represents a docking board, e.g., a board for consolidating various parts used to control fans, distribute power, provide server management, and control storage. Alternatively, PCB 150 can be another type of circuit board, e.g., an I/O board that includes various types of controllers and sockets for receiving PCI cards and/or other daughter cards. To attach PCB 150 to a chassis, carrier 100 is fixed to PCB 150 such that base 130 covers the PCB's low profile components, while high profile components slip through openings 108, and indented sections 118 skirt around others. PCB 150 can then be attached to the chassis by simply feeding screws 138 through holes 149 and then coupling them to sockets formed on the chassis.

By allowing low profile components to be positioned underneath plate 101, receptacles 102 enable cut out requirements for carrier 100 to be simplified, i.e., less openings and indented sections are needed to accommodate PCB parts. In addition, receptacles 102 allow cool air to flow between plate 101 and the PCB to cool those components. If desired, additional openings can be cut out of carrier 100 to increase airflow over the PCB's thermally sensitive components, which are positioned below plate 101. When carrier 100 is attached to PCB 150, components for coupling to parts mounted on the PCB can pass through openings 108, as can relatively high profile components that are attached to the PCB.

An improved computer assembly has been described, which includes a captivated screw carrier that prevents loose screws from damaging a computer, or interfering with its operation, without placing undesirable constraints on PCB layout. Because the captivated screws are fixed to the carrier instead of to the PCB, a technician can install or remove all PCB retention screws as a single unit without having to worry about dropping them into the chassis. Because the captivated screws are attached to a carrier, no restrictions are placed on PCB layout over those that apply when using loose fasteners. An assembler thus can use the carrier of the present invention instead of discrete fasteners without having to modify the PCB in any way whatsoever. In this respect, the present invention allows identical hole diameters, keep outs and grounding schemes to be used in either case.

Those skilled in the art will recognize that this assembly, in addition to providing an improved mechanism for using captivated screws to connect a PCB to a computer chassis, can provide other advantages. For example, the captivated screw carrier may be designed and positioned in such a way that it helps direct air flow onto components that dissipate significant heat. In addition, by positioning the carrier over high voltage components, the device may assist with voltage isolation. By forming the carrier from sheet metal, or by adding a thin layer of aluminum or another metal to the carrier's upper surface, it may help reduce EMI.

Features shown in the above referenced drawings are not intended to be drawn to scale, nor are they intended to be shown in precise positional relationship. Additional components that the above described computer assembly may contain have been omitted as they are not useful to describe aspects of the present invention.

Although the foregoing description has specified a computer assembly that includes certain features, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A computer assembly comprising:
   a plate that includes a plurality of receptacles for receiving a plurality of fasteners, and a plurality of openings for enabling components to pass through the plate, the plate further including a plurality of indented sections that each straddle a printed circuit board component;
   a plurality of fasteners, each being coupled to a receptacle, the plurality of fasteners comprising a plurality of captivated screws, each having a casing that holds a screw, the casing enabling the screw to independently move along a line that is perpendicular to the plane of the plate, each captivated screw including a plurality of expandable prongs that extend through a receptacle and latch underneath it to bind the captivated screw to the receptacle; and
   a printed circuit board, which is attached to the plate by the plurality of fasteners, wherein a plurality of components pass through the openings formed in the plate.

2. The computer assembly of claim 1 wherein the plate is made of plastic.

3. The computer assembly of claim 2 wherein each receptacle forms a pocket that extends a distance from the plane of the plate, causing the plate to be spaced from the printed circuit board by that distance.

4. The computer assembly of claim 3, wherein the plurality of components that pass through the openings formed in the plate comprise cables that are coupled to components that are mounted to the printed circuit board.

5. The computer assembly of claim 3 wherein the plurality of components that pass through the openings formed in the plate comprise devices that are mounted to the printed circuit board.

6. A computer assembly comprising:
   a chassis;
   a plate that includes a plurality of receptacles for receiving a plurality of captivated screws, and a plurality of openings for enabling printed circuit board components to pass through it, the plate further including a plurality of indented sections that each straddle a printed circuit board component;
   a plurality of captivated screws, each being coupled to a receptacle, each having a casing that holds a screw, the casing enabling the screw to independently move along a line that is perpendicular to the plane of the plate, and each including a plurality of expandable prongs that extend through a receptacle and latch underneath it to bind the captivated screw to the receptacle; and
   a printed circuit board having a plurality of holes, a captivated screw passing through each hole to attach the plate to one side of the printed circuit board and to attach the other side of the printed circuit board to the chassis.

7. The computer assembly of claim 6 wherein the plate is made of plastic.

8. The computer assembly of claim 7 wherein each receptacle forms a pocket that extends a distance from the plane of the plate, causing the plate to be spaced from the printed circuit board by that distance.

9. A computer assembly comprising:
   a chassis;
   a plate, made of plastic, that includes a plurality of receptacles for receiving a plurality of captivated screws, and a plurality of openings for enabling printed circuit board components to pass through it, the plate further including a plurality of indented sections that each straddle a printed circuit board component;

a plurality of captivated screws, each having a casing that holds a screw, the casing enabling the screw to independently move along a line that is perpendicular to the plane of the plate, and each having a plurality of expandable prongs that extend through a receptacle and latch underneath it to bind the captivated screw to the receptacle; and a printed circuit board having a plurality of holes, a captivated screw passing through each hole to attach the plate to one side of the printed circuit board and to attach the other side of the printed circuit board to the chassis.

10. The computer assembly of claim 9 wherein the plate consists of a single integrated plastic part that includes a substantially rectangular base with an elongated section formed along one side, both the rectangular base and the elongated section including receptacles for receiving a plurality of captivated screws.

11. The computer assembly of claim 10 wherein each receptacle forms a pocket that extends a distance from the plane of the plate, causing the plate to be spaced from the printed circuit board by that distance.

* * * * *